United States Patent
Moriya et al.

(10) Patent No.: US 6,949,474 B2
(45) Date of Patent: Sep. 27, 2005

(54) METHOD OF MANUFACTURING A SEMICONDUCTOR DEVICE AND A SEMICONDUCTOR MANUFACTURE SYSTEM

(75) Inventors: Atsushi Moriya, Tokyo (JP); Yasuhiro Inokuchi, Tokyo (JP); Yasuo Kunii, Tokyo (JP); Junichi Murota, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 22 days.

(21) Appl. No.: 10/359,127

(22) Filed: Feb. 6, 2003

(65) Prior Publication Data

US 2004/0007185 A1 Jan. 15, 2004

(30) Foreign Application Priority Data

Feb. 6, 2002 (JP) .................................... 2002-029671
Feb. 3, 2003 (JP) .................................... 2003-026431

(51) Int. Cl.$^7$ .......................................... H01L 21/31
(52) U.S. Cl. ....................... 438/761; 438/763; 118/50; 118/724
(58) Field of Search .................. 438/758, 761, 438/762, 763, 660, 663, 715; 118/50, 724, 725

(56) References Cited

U.S. PATENT DOCUMENTS 5,976,990 A * 11/1999 Mercaldi et al. ............ 438/762

FOREIGN PATENT DOCUMENTS

JP       A 7-297205       11/1995

* cited by examiner

Primary Examiner—Kevin M. Picardat
(74) Attorney, Agent, or Firm—Oliff & Berridge, PLC (57) ABSTRACT

This invention makes it possible to make even films composed of at least silicon and germanium with gradient germanium ratio along a film thickness direction thereof for a short deposition time. A temperature controller 61 controls a heater 2 so that temperature of wafers W will be changed from low (e.g. 400° C.) to high (e.g. 700° C.) by alternately repeating temperature changing process to heat up the wafers W and temperature regulating process when temperature of the wafers W does not change as much as that of the temperature changing process for a specific amount of time. While a gas controller 62 provides a reactive gas into a reaction tube 1 during the temperature regulating process, it controls a valve 31 to stop it during the temperature changing process.

10 Claims, 5 Drawing Sheets

METHOD OF MANUFACTURING A SEMICONDUCTOR DEVICE AND A SEMICONDUCTOR MANUFACTURE SYSTEM

BACKGROUND OF THE INVENTION

1. Field of the Invention

This invention relates to a method of manufacturing a semiconductor device for depositing a film being composed of silicon and germanium, and a semiconductor manufacture system for practicing the method of manufacturing the semiconductor device.

2. Description of Related Art

Figure 3:
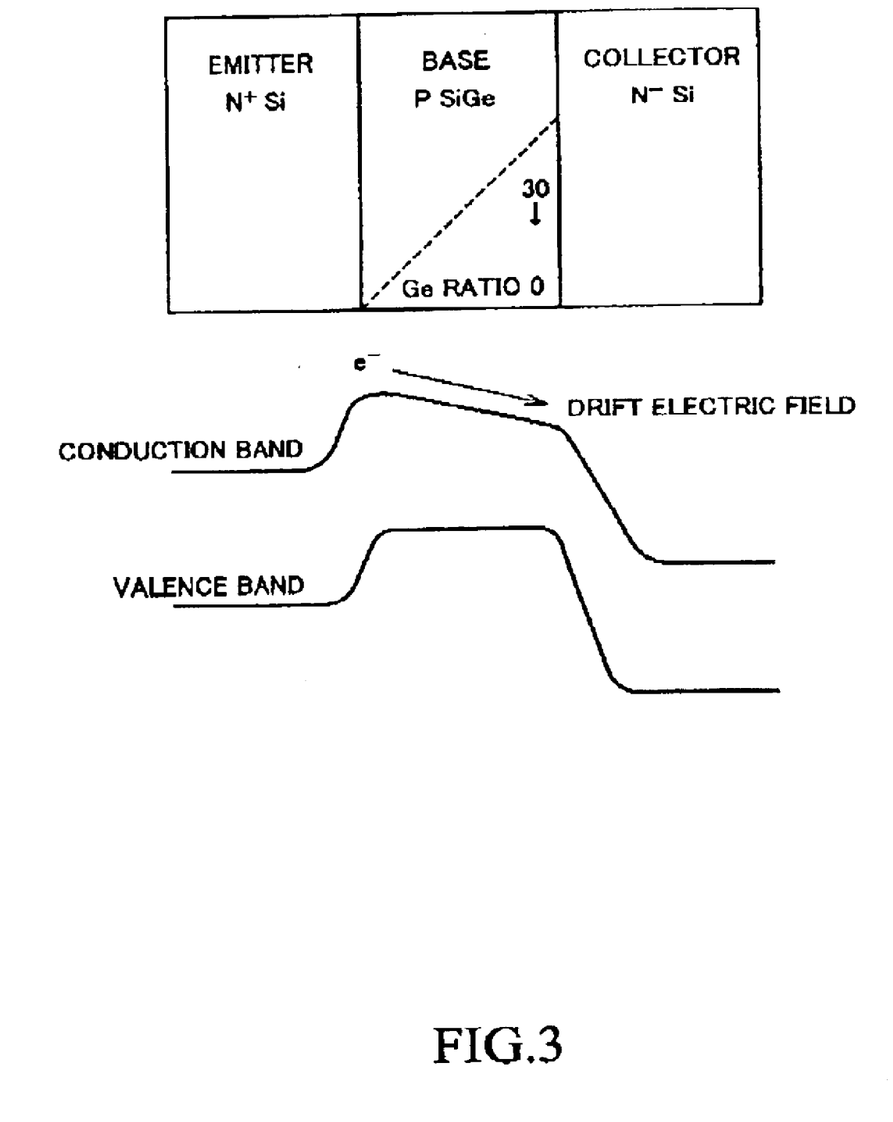
FIG. 3 is a diagrammatic view for showing a composition of Hetero Bipolar Transistor.

Hetero Bipolar Transistor (HBT) using SiGe or SiGeC attracts a great deal of attention because of its high-speed, low-noise, and low electricity. FIG. 3 is a diagrammatic view which shows a composition of HBT using SiGe (SiGe-HBT). As shown in this drawing, SiGe-HBT is provided, in its base region, to include Ge which has smaller band gap than Si (silicon) and is added therein subsequently within the range of 0–30% to have a slope on its conduction band. This presents a drift electric field and accelerates electron to thereby attain the high speed.

To be more precise, SiGe-HBT typically utilizes a silicon wafer as silicon substrate thereof to obtain a SiGe film as its base layer by epitaxially growing SiGe mixed crystal on the silicon wafer. The base layer is so composed that a concentration of Ge gets smaller composition ratio of Ge from a collector layer to an emitter layer in a film thickness direction thereof. HBT using SiGeC (SiGeC-HBT) can be naturally composed as those in SiGe-HBT.

When SiGe or SiGeC (hereinafter referred to as SiGe (C)) as the base layer is deposited on the collector layer in order to manufacture SiGe-HBT or SiGeC-HBT and other film, a Ge fraction in the film needs to be decreased in sequence or in phase.

When $SiH_4$ (monosilane) and $GeH_4$ (germane) are used as reactive gases (source gases), and $H_2$ (hydrogen gas) is used as a carrier gas, the Ge fraction in the SiGe(C) film can be controlled by a gas partial pressure rate of $SiH_4$ and $GeH_4$ i.e., a flow rate in a reaction chamber where the silicon wafer is placed. A typical example will be described as follows.

Figure 4:
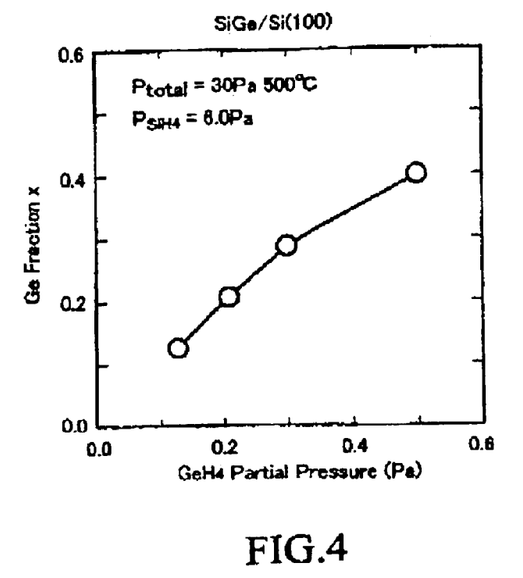
FIG. 4 is a graph for showing a partial pressure dependence of $GeH_4$ regarding Ge fraction when depositing SiGe.

FIG. 4 shows a partial pressure dependence of $GeH_4$ regarding Ge fraction when depositing SiGe. In FIG. 4, a horizontal axis indicates $GeH_4$ partial pressure (proportional to a flow rate of $GeH_4$), and a vertical axis indicates Ge fraction in the SiGe film, when fixed at 500° C. as deposition temperature, at 30 [Pa] as total pressure in the reaction chamber, and at 6 [Pa] as $SiH_4$ partial pressure. As can be seen from this drawing, by decreasing the $GeH_4$ partial pressure, a region of small Ge fraction can be obtained. This means Ge fraction can be smaller by decreasing flow rate of $GeH_4$.

Figure 5:
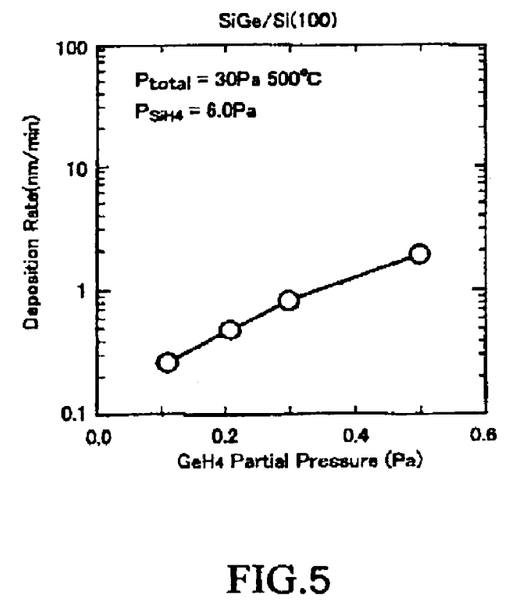
FIG. 5 is a graph for showing a partial pressure dependence of $GeH_4$ regarding deposition rate when depositing SiGe.

FIG. 5 shows a partial pressure dependence of $GeH_4$ regarding deposition rate when depositing SiGe. In FIG. 5, a horizontal axis indicates $GeH_4$ partial pressure (a flow rate of $GeH_4$), and a vertical axis indicates deposition rate [nm/min] in the SiGe film, when fixed at 500° C. as deposition temperature, at 30 [Pa] as total pressure in the reaction chamber, and at 6 [Pa] as $SiH_4$ partial pressure. Common logarithm is used on the vertical axis in FIG. 5. As shown in this drawing, the smaller $GeH_4$ partial pressure is, the slower SiGe deposition rate is.

FIG. 4 and FIG. 5 show the SiGe deposition state as one typical example, and the same results will be available when SiGeC is used.

Accordingly, when SiGeC is deposited under the above-mentioned condition, the region of the smaller Ge fraction can be formed by sequentially decreasing the $GeH_4$ flow rate. However, SiGeC deposition rate will be slow by decreasing a flow rate of $GeH_4$. In other words, forming time for a region of low Ge fraction is longer than that for a region of high Ge fraction. The details will be verified hereinafter.

As an experimental example of a conventional invention, a SiGe film is formed under the condition at 500° C. as deposition temperature, at 30 [Pa] as total pressure in the reaction chamber, and at 6 [Pa] as $SiH_4$ partial pressure. While changing Ge fraction by negative one percent from 25% to 1%, the SiGe films each containing a relative Ge fraction were made, each being 1.5 nm thick and the total of them being 37.5(=25×1.5) nm thick.

Figure 6:
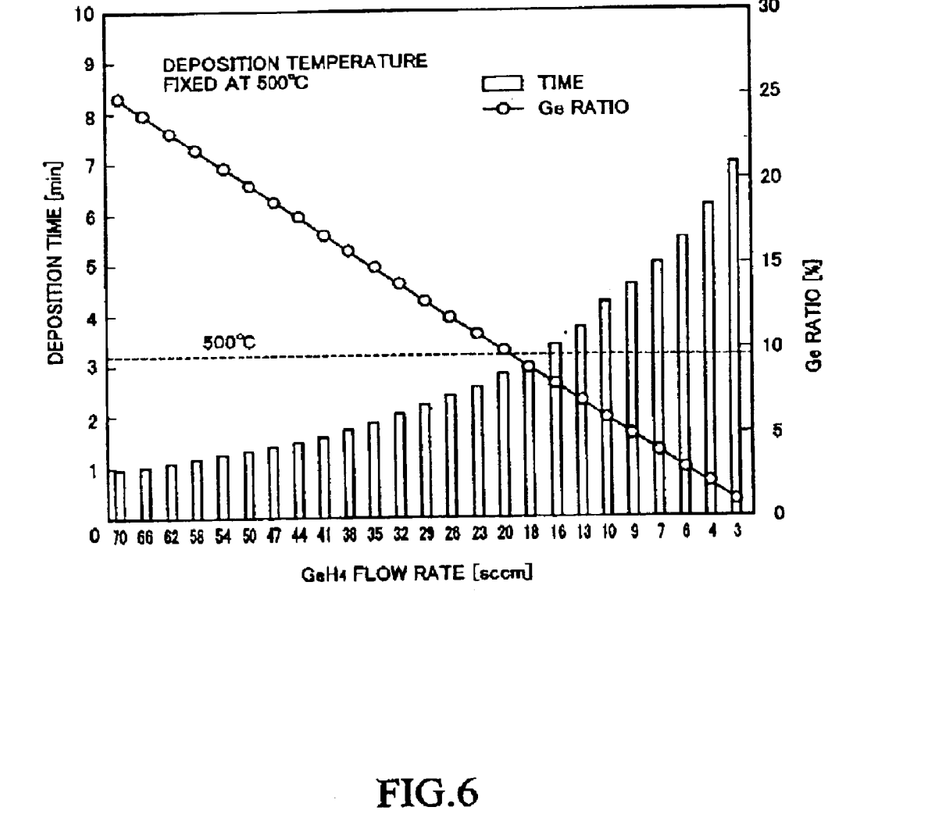
FIG. 6 is a view for showing embodiments of conventional technique.

FIG. 6 shows the relationship between $GeH_4$ flow rate, Ge fraction and deposition time. In FIG. 6, a horizontal axis indicates $GeH_4$ flow rate [sccm], and both vertical axes indicate Ge fraction [%] and deposition time [min], respectively.

In FIG. 6, a continuous line plotted with white dots shows change of Ge fraction in relation to $GeH_4$ flow rate. As shown in this drawing, these two are almost proportional under this condition. Ge fraction varies by the rate of negative one percent from 25% to 1%.

In FIG. 6, a bar graph is also drawn to show the time to make the SiGe film of 1.5 nm thick every plot at the corresponding flow rate of $GeH_4$ (Ge fraction).

As shown in FIG. 6, in case of obtaining the SiGe film with the same thickness (1.5 [nm]), the smaller the $GeH_4$ flow rate is, and that means the lower the Ge fraction is, the more it takes time for deposition. As has been described above, this is because the smaller $GeH_4$ flow rate is, the slower deposition rate is. For example, when the flow rate of $GeH_4$ is 50 [sccm], the necessary time to deposit a film of 1.5 nm thick is 1.3 minutes. In contrast, when the flow rate of $GeH_4$ is 10 [sccm] (Ge fraction is 6%), the necessary time to make its counterpart is 4.3 minutes.

In this case, the total time to obtain the SiGe film of 37.5 nm thick was 70 minutes.

As described above, there was a problem that deposition rate would be slow and deposition time would be long as the $GeH_4$ flow rate would be low in the case of decreasing Ge ratio sequentially on making a SiGe (C) film.

In order to solve this problem, patent application Number: Hei 7-297205 proposes, by using the so-called cold wall type single-wafer CVD system, a manufacturing method of a semiconductor device for decreasing a $GeH_4$ flow rate while rising temperature between 5 to 30° C./minute. According to this method, by making a SiGe film while rising temperature by the above-mentioned degrees, deposition rate will not be slow when forming a region of small Ge ratio. Therefore, deposition time will be shorter than that when keeping the same deposition temperature.

The above-mentioned technique demonstrated faster deposition rate than conventional techniques for deposition; however, many issues still remain being unsolved about a request of the field. Especially, there is a room for improvement about how to make even thickness of the SiGe(C) film.

To be more precise, while changing deposition temperature to obtain the film by using this conventional method, thermal distribution of wafer becomes uneven while making it. Therefore, the thickness of the SiGe (C) film tends to be uneven.

This problem becomes especially serious when using a hot wall batch-type system which produces large quantity of films. That is, heat conduction of the inner side of the wafer is slow compared with that of the outer side. Therefore, when making the SiGe (C) film by rising deposition temperature, the outer side of the wafer has higher temperature than the inner side. The film thickness of the outer side becomes thick, and that of the inner side becomes thin.

SUMMARY OF THE INVENTION

An object of the present invention is to provide technique of how to make an even film in a short period of time, the film being composed of at least silicon and germanium and showing different Ge composition ratio along a film thickness direction thereof.

In a method of manufacturing a semiconductor device, according to a first embodiment of this invention, for depositing films being composed of at least silicon and germanium collocated on a substrate or substrates in a reaction chamber so that ratio of the germanium composition is changed along a film thickness direction thereof, the improvement comprising: changing temperature of the substrate or the substrates from high to low or from low to high by alternately repeating temperature changing process for changing temperature of the substrate or the substrates and temperature regulating process when temperature of the substrate or the substrates does not change as much as that during the temperature changing process; depositing the films composed of at least the silicon and germanium by providing a reactive gas which contains silicon and germanium into the reaction chamber during the temperature regulating process; and processing the substrate or the substrates by lowering partial pressure of the reactive gas during the temperature changing process than during the temperature regulating process.

The method of manufacturing the semiconductor device according to the first embodiment of this invention prevents depositing uneven films due to uneven temperature distribution on the substrate or the substrates because the films are not deposited during the temperature changing process when temperature distribution of the substrate or the substrates tends to be uneven, and because they are deposited during the temperature regulating process when temperature distribution of the substrate or the substrates tends to be even and when temperature stability is improved, compared to the temperature changing process. This procedure makes it possible to deposit even films composed of silicon and germanium. Furthermore, since temperature of the substrate or the substrates changes from high to low or from low to high, deposition rate will not be slow by setting up high temperature of the substrates when forming regions of low Ge composition ratio. This procedure makes deposition time to be shorter. Furthermore, since the substrate or the substrates is/are processed by lowering partial pressure of the reactive gas during the temperature changing process than during the temperature regulating process, deposition on the substrate or the substrates is avoided during the temperature changing process.

A silicon-containing gas and a germanium-containing gas are an example of the above-described reactive gas. $SiH_4$ gas, and $Si_2H_6$ gas and the like are listed as the silicon-containing gas. $GeH_4$ gas and the like are listed as the germanium-containing gas.

An example of the films deposited of mixed crystals of at least silicon and germanium is a SiGe film, a SiGeC film or the like. They are used for electron devices such as HBT or MOSFET.

In this case, partial pressure of the germanium-containing gas should be constantly the same during every temperature regulating process, and this pressure should be changed during every temperature changing process between every temperature regulating process. Therefore, germanium composition ratio is changed along a film thickness direction.

Also, during every temperature regulating process, also by changing partial pressure of the germanium-containing gas at least twice or more in phase, or in sequence, the germanium composition ratio is changed along the film thickness direction. In this case, this ratio will be changed more smoothly along the film thickness direction thereof. Therefore, performance of the semiconductor device that comprises the above-described films is greatly improved.

The temperature regulating process, when temperature of the substrate or the substrates does not change as much as that during the temperature changing process, also comprises a process for maintaining the constant temperature of the substrates.

Furthermore, by lowering the flow rate of the reactive gas providing into the reaction chamber during the temperature changing process than during the temperature regulating process, or by stopping it there, partial pressure of the reactive gas will be lowered during the temperature changing process than during the temperature regulating process, or it will be almost stopped. Lowering partial pressure of the reactive gas comprises not only the case of lowering partial pressure of the reactive gas among a component gas which composes an atmosphere gas in the reaction chamber, but also the case of lowering total pressure of the atmosphere gas there, regardless of the flow rate of the reactive gas.

The method of manufacturing the semiconductor device according to the second embodiment of this invention is characterized to maintain the constant temperature of the substrate or the substrates during the above-described temperature regulating process in the method of manufacturing the semiconductor device according to the first embodiment.

In the method of manufacturing the semiconductor device according to the second embodiment of this invention, less amount of films or no films are deposited during the temperature changing process when temperature distribution of a substrate or substrates tends to be uneven, and films are deposited during the temperature regulating process when temperature distribution of a substrate or substrates tends to be even. Therefore, uneven film thickness due to uneven temperature distribution on substrates will not happen. Thereby, even films composed of silicon and germanium will be deposited.

In the method of manufacturing the semiconductor device according to the first or second embodiment, the method of manufacturing the semiconductor device according to the third embodiment of this invention is characterized to exhaust the reactive gas remaining in the reaction chamber during the temperature changing process.

In the method of manufacturing the semiconductor device according to the third embodiment, the reactive gas remaining in the reaction chamber is exhausted during the temperature changing process when temperature distribution of the substrate or the substrates tends to be uneven. Therefore, deposition on substrates can be surely avoided during the above-described temperature changing process.

To be more precise about the above-described embodiment of this invention, feeding a carrier gas (purge gas) in the reaction chamber exhausts the reactive gas remaining in the reaction chamber.

$H_2$, Ar, He, Kr, $N_2$ and the like are examples of the reactive gases.

Vacuuming in the reaction chamber also exhausts the reactive gas remaining there according to the above-described embodiment of this invention.

In the method of manufacturing the semiconductor device according to the first or second embodiment, the fourth embodiment of the method of manufacturing the semiconductor device is characterized to contain the above-mentioned reactive gas which comprises a first reactive gas containing silicon and a second reactive gas containing germanium. Partial pressure of the second reactive gas in the reaction chamber is changed in sequence or in phase during the temperature regulating process.

According to the fourth embodiment of this invention, partial pressure of the second reactive gas in the reaction chamber is changed in sequence or in phase during the temperature regulating process; therefore, germanium composition ratio is changed more smoothly along the film thickness direction. Therefore, performance of the semiconductor device that comprises the above-mentioned films is greatly improved.

In the method of manufacturing a semiconductor device, according to a fifth embodiment of this invention, for depositing films being composed of at least silicon and germanium collocated on a substrate or substrates in a reaction chamber so that ratio of the germanium composition is changed along a film thickness direction thereof, the improvement comprising: changing temperature of the substrate or the substrates from high to low or from low to high by alternately repeating temperature changing process for changing temperature of the substrate or the substrates and temperature regulating process when temperature of the substrate or the substrates does not change as much as that during the temperature changing process; depositing the films composed of at least the silicon and germanium by providing a reactive gas which contains silicon and germanium into the reaction chamber during the temperature regulating process; and processing the substrate or the substrates by lowering the flow rate of the reactive gas during the temperature changing process than during the temperature regulating process.

The method of manufacturing the semiconductor device according to the fifth embodiment is characterized that the flow rate of the reactive gas is lowered instead that partial pressure of the reactive gas is lowered. According to this method, by lowering the flow rate of the reactive gas providing into the reaction chamber during the temperature changing process than during the temperature regulating process, or by stopping it there, partial pressure of the reactive gas will be lowered during the temperature changing process than during the temperature regulating process, or it will be almost stopped.

In the method of manufacturing the semiconductor device according to the first or the fifth embodiment, the method of manufacturing the semiconductor device according to the sixth invention of this invention is characterized that the films are not substantially deposited on the substrate or the substrates during the temperature changing process.

In the method of manufacturing the semiconductor device according to the sixth embodiment, since the films are not substantially deposited on the substrate or the substrates during the temperature changing process, no room for depositing uneven films due to uneven temperature distribution on the substrate or the substrates will be left during the temperature changing process.

In the method of manufacturing the semiconductor device according to the first or the second embodiment, the method of manufacturing the semiconductor device according to the seventh invention of this invention is characterized to contain the reactive gas which comprises a first reactive gas containing silicon and a second reactive gas containing germanium. Partial pressure of the second reactive gas in the reaction chamber is changed in phase during the temperature regulating process, and deposition time will be changed at each phase.

According to the seventh embodiment of this invention, partial pressure of the second reactive gas in the reaction chamber is changed in phase during the temperature regulating process, and deposition time will be changed at each phase. Therefore, germanium composition ratio will be changed more smoothly along the film thickness direction, and performance of a semiconductor device comprising the above-described film will be improved.

In the method of manufacturing the semiconductor device according to the seventh embodiment, the method of manufacturing the semiconductor device according to the eighth embodiment is characterized to select the deposition time when thickness of the films is almost the same at each phase.

According to the eighth embodiment of this invention, the deposition time at each phase during the temperature regulating process is the time when thickness of the films is almost the same at each phase. Therefore, the ratio of germanium composition will be changed more smoothly along the film thickness direction, and performance of the semiconductor device comprising the above-described film will be improved.

The ninth embodiment of this invention provides the method of manufacturing the semiconductor device by depositing a base layer of the semiconductor device that contain lamination structure comprising a collector layer, the above-described base layer, and an emitter layer according to the first or the second embodiment.

According to the tenth embodiment of this invention, in a semiconductor manufacture system for depositing films composed of at least silicon and germanium on a substrate or substrates in a reaction chamber so that the germanium composition ratio is changed along a film thickness direction thereof the semiconductor manufacture system is characterized to provide a temperature controller which changes temperature of the substrate or the substrates from high to low or from low to high by alternately repeating temperature changing process for changing temperature of the substrate or the substrates and temperature regulating process when temperature of the substrate or the substrates does not change as much as that during the temperature changing process; and a gas controller which provides a reactive gas which contains at least silicon and germanium into the reaction chamber during the temperature regulating process, as well as for lowering partial pressure of the reactive gas during the temperature changing process than that during the temperature regulating process.

DETAILED DESCRIPTION OF THE PREFERRED EMBODIMENT

Figure 1:
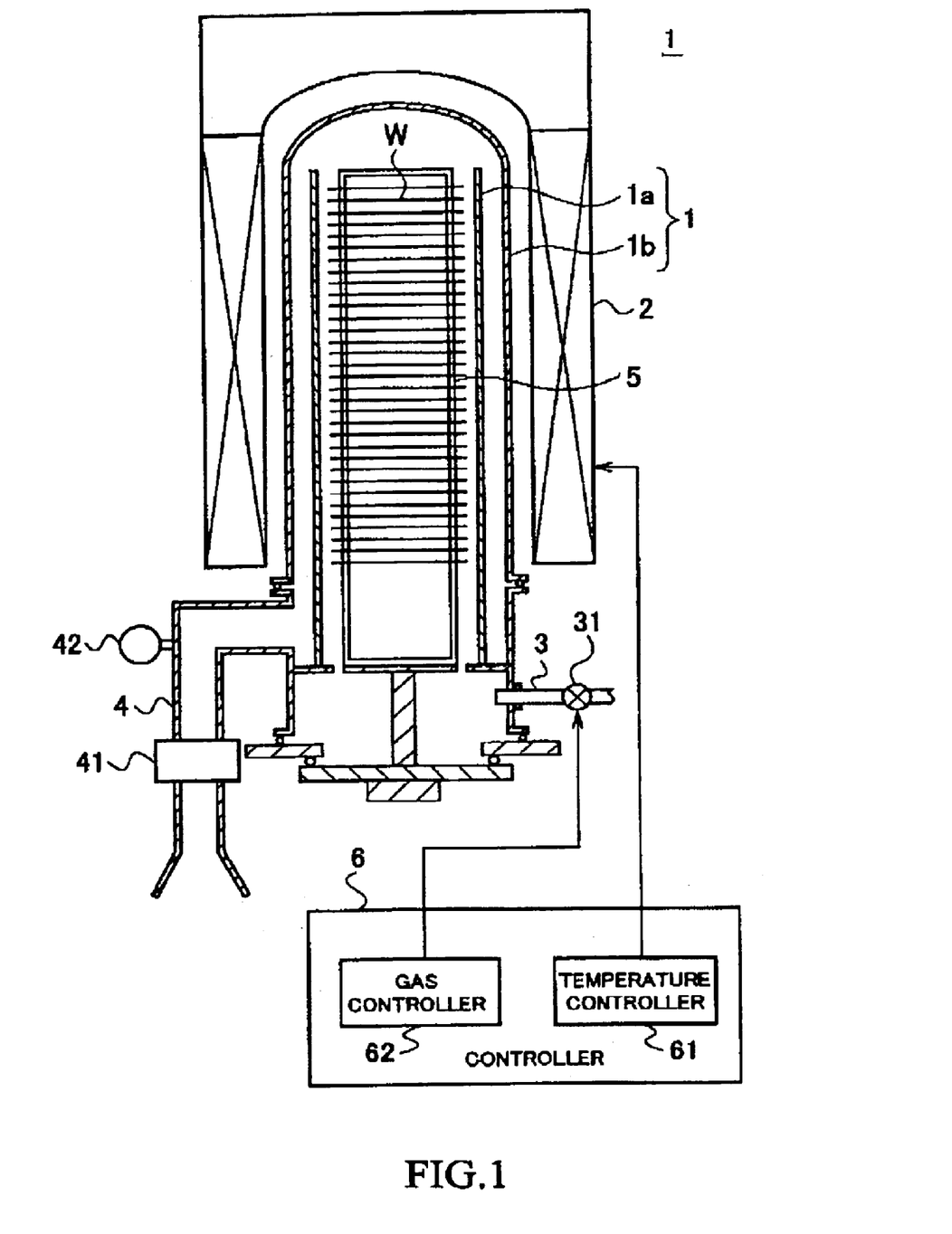
FIG. 1 is a schematic view for showing the vertical structure of a reactor of a semiconductor manufacture system used for this embodiment.

FIG. 1 is a schematic view for showing the vertical structure of a reactor of a semiconductor manufacture system used for this invention. This system is so-called a vertical hot wall type CVD system. As can be seen in FIG. 1, it is structured with a reaction tube (reaction chamber) 1 where wafers W (substrates) are collocated, a heater 2, as a heating means, which surrounds the reaction tube 1, a gas feeding pipe 3 to flow at least reactive gas into the reaction tube 1, and a gas exhausting pipe 4 to exhaust gas in the reaction tube 1.

$SiH_4$ gas and $GeH_4$ gas are used as the reactive gas.

The reaction tube 1 has the dual pipe structure which consists of an inner pipe 1a, and an outer pipe 1b.

The gas feeding pipe 3 has a valve 31 to control the flow rate of the reactive gas flowing in the gas feeding pipe 3. A carrier gas and another gas may flow in the gas feeding pipe 3. Furthermore, the gas exhausting pipe 4 is provided with a pump 41 to exhaust the gas in the reaction tube 1, and a vacuum gage 42.

Wafers W are collocated in the reaction tube 1 in a vertical multistage typed boat 5.

Not shown in this drawing, however, the heater 2 is vertically separated in four or five zones to highly efficiently control temperature in the reaction tube 1, and electricity to each zone is controlled by a temperature controller 61 which will be described later. Each zone is named as, from the top, U zone, CU zone, CL zone, L zone (if separated into four), and U zone, CU zone, C zone, CL zone, and L zone (if separated into five).

As schematically shown in FIG. 1, this semiconductor manufacture system has a controller 6 to control each part which constructs this system. Films that are made by mixed crystal of SiGe are deposited on the wafers W in the reaction tube 1 by the controller 6 so that Ge fraction will be changed in the film thickness direction. Therefore, the controller 6 functions to control $GeH_4$ gas flow rate and to purge or vacuum gas in the reaction tube 1.

Especially, as schematically shown in FIG. 1, the controller 6 is characterized to have a temperature controller 61 to control heating temperature of the heater 2, and a gas controller 62 to control the reactive gas flow. These two controllers 61, 62 can be substituted by e.g., software.

The following is the operational description of this semiconductor manufacture system.

When making the SiGe films, the temperature controller 61 controls the heater 2 so that the temperature of the wafers W will be changed from low (e.g. 400° C.) to high (e.g. 700° C.) by alternately repeating temperature changing process to heat up the wafers W and temperature regulating process when temperature of the substrates does not change as much as that during the temperature changing process. That means deposition temperature will be escalated in phase from 400° C. to 700° C.

To be more precise, the temperature controller 61 elaborately controls the heater 2 by rising deposition temperature for a specific speed during the temperature changing process, and by maintaining the same deposition temperature during the temperature regulating process.

The time for the temperature changing process is the total time to heat up the reaction tube 1 for a specific rising speed, and to soak all wafers W in the reaction tube 1 after heating them up.

The gas controller 62 flows the reactive gas in the reaction tube 1 during the temperature regulating process, while it controls the valve 31 so that it will stop the reactive gas feeding therein during the temperature changing process. That means the SiGe films are not deposited by stopping the reactive gas feeding when the temperature of the wafers W is rising (temperature changing process), and they are made by flowing the reactive gas when its temperature is stabilized (temperature regulating process).

During every temperature regulating process, the controller 6 controls partial pressure of $GeH_4$ gas among the reactive gases so that the pressure will be sequentially decreased. This is how Ge composition ratio will be decreased little by little along a growing direction of the SiGe film.

As described above, in order to lower Ge fraction at the same temperature, the less the flow rate of $GeH_4$ gas is, the slower the deposition rate is. Therefore, the films will be efficiently made, when the temperature regulating process is defined at and below the specific deposition rate.

Furthermore, the controller 6 controls to purge the reactive gas remaining in the reaction tube 1 just by flowing a carrier gas therein during the temperature changing process. It is desirable that the purging pressure is controlled at e.g., 0.1–100 [Pa]. During this temperature changing process, it is also available that the controller 6 vacuums the reaction tube 1 by controlling the pump 41. It is also recommended that the vacuuming pressure be regulated under 1 [Pa].

Accordingly, uneven films not be made for sure by the remaining reactive gas in the reaction tube 1 during the temperature changing process when the temperature of the wafers W may not be stable.

This semiconductor manufacture system accomplishes the following effects.

(1) When using the conventional vertical system, the rise of temperature at the bottom of the heater 2 (L zone) is slower than that at the center (CU zone, C zone, or CL zone), and also there is a difference of temperature between the center and fringe of the wafers W. Accordingly, there was a problem of unevenness of wafers W thickness. In contrast, by employing this invented system, the reactive gas flow is stopped while rising temperature, and the films are made when deposition temperature is stable. Therefore, there will be no problem of unevenness of temperature on the wafers W and film thickness will be the same compared to when making the films with temperature rising.

(2) Temperature will be up from 400° C. to 700° C. when making films. Therefore, deposition rate will not be slow by lowering $GeH_4$ partial pressure. Deposition time will also be much shorter. That means when making the SiGe (C) films by using the gas which contains silicon such as $SiH_4$ or $Si_2H_6$ and the $GeH_4$ gas, the higher the deposition temperature is, the faster the deposition rate is in reaction rate determining region. In contrast, when the temperature is the same, the smaller $GeH_4$ gas flow rate is, the slower the deposition rate is for lowering Ge fraction. Therefore, when $GeH_4$ gas flow rate is decreased in order to lower Ge fraction, deposition rate will not be slow as long as deposition temperature is high.

OPERATIONAL EXAMPLE

The following is an example of SiGe deposition when using the above-described semiconductor manufacture system.

In this system, total pressure in the reaction tube 1 was fixed at 30 [Pa], and partial pressure of $SiH_4$ was fixed at 6

[Pa]. Controlling GeH$_4$ gas flow rate from the controller 6 the SiGe films each containing the corresponding Ge ratio are made while changing the Ge ratio by negative one percent from 25% to 1%, each being 1.5 nm thick, and the total of them being 37.5(=25×1.5) nm thick.

Figure 2:
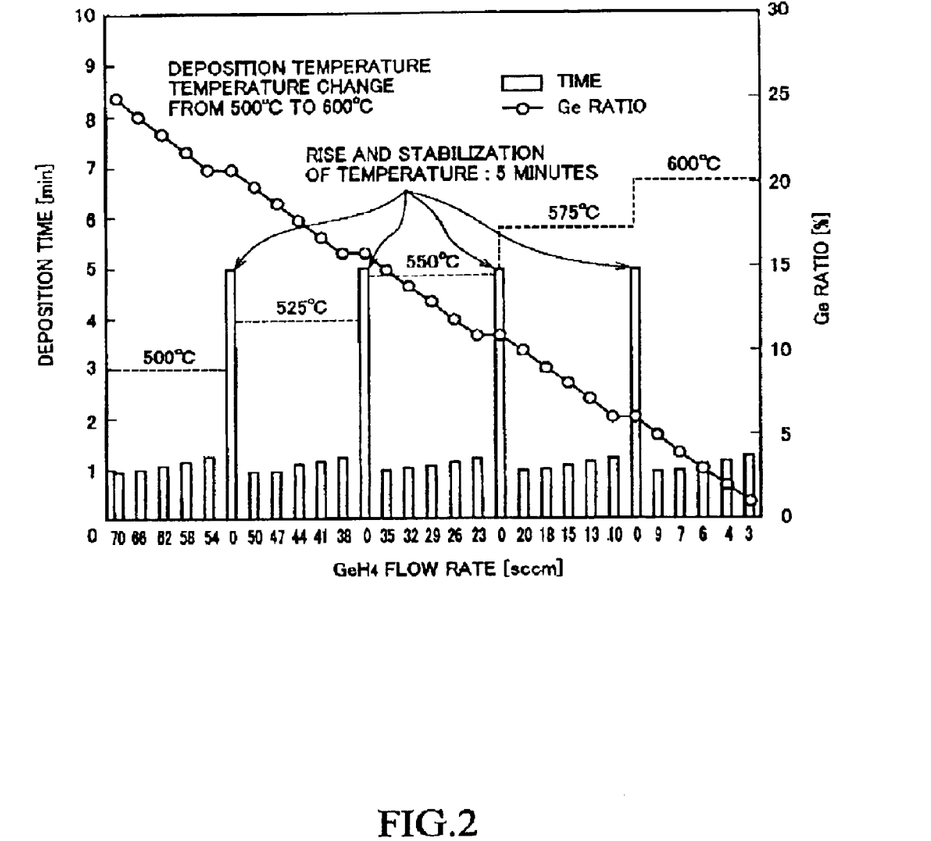
FIG. 2 is a view for showing an embodiment of this invention.

FIG. 2 shows the relationship between GeH$_4$ gas flow rate, Ge ratio and deposition time. In FIG. 2, a horizontal axis shows a process to change from left to right when deposition temperature goes up, and from right to left when it goes down, and GeH$_4$ gas flow rate [sccm] at every process has also been added. Both vertical axes show Ge ratio (%) and deposition time [min], respectively.

The temperature of wafers W is controlled by the temperature controller 61 to rise step by step with 25° C. interval between 500° C. and 600° C. by alternately repeating temperature changing process and temperature regulating process. This means, as shown with the dotted line in FIG. 2, deposition temperature is rising by five steps from 500° C., 525° C., 550° C., 575° C., to 600° C.

Time intervals of each temperature changing process are 5 minutes.

Heating times of wafers W with 25° C. per minute are one minute, and stabilizing times of them are four minutes.

The films were made, being controlled by the gas controller 62, in a way that the reactive gas does not flow through a reaction tube 1 during the temperature changing process, and that the SiH$_4$ gas and the GeH$_4$ gas flows through the same during the temperature regulating process. Furthermore, the carrier gas is fed through the reaction tube 1 during the temperature changing process so that the remaining reactive gas would be purged.

Each length of the bar graph in FIG. 2 indicates time to deposit a SiGe film of 1.5 nm thick except where GeH$_4$ flow rate is 0 sccm, and time to change temperature (5 minutes) without depositing a film where GeH$_4$ flow rate is 0 sccm, during every process when GeH$_4$ flow rate shown in the horizontal axis is changing.

The total length of the bar graph in FIG. 2 is approximately 46 minutes. Deposition time by this invention is 24 minutes shorter than that by the conventional invention (70 minutes) (See FIG. 6). Shorter deposition time will be especially effective for depositing thicker films.

Thickness of SiGe films made by this invention is proved to be extremely even.

The above is the preferable embodiment of this invention, but not limited to it.

(a) In this embodiment, temperature of a substrate or substrates is fixed during every temperature regulating process. However, this invention is applicable when temperature of a substrate or substrates is changed as long as change of temperature of a substrate or substrates during temperature regulating process is smaller than that at the temperature changing process, and as long as temperature stability is improved.

(b) Furthermore, films are not deposited by stopping reactive gas flow during the temperature changing process; however a small amount of the films may be deposited by lowering partial pressure of the reactive gas. In order to lower the partial pressure of the reactive gas, not only lowering the partial pressure of the reactive gas among an atmosphere gas remaining in a reaction chamber, but also lowering total pressure of the atmosphere gas there are acceptable. The partial pressure of the reactive gas can also be lowered by lowering the reactive gas flow rate, or increasing flow rate of inert gas while comparing to the reactive gas flow rate flowing in the reaction chamber.

(c) In this embodiment, the Ge fraction is gradually decreased toward the growth direction of SiGe film. However, this invention can be certainly applied to gradually increase Ge fraction toward a growth direction of SiGe film as, for example, the order of a collector layer, a base layer and an emitter layer is reversed from the order shown in FIG. 3.

In this case, the temperature controller 61 controls the heater 2 so that deposition temperature will go down in phase from high (e.g., 700° C.) to low (e.g., 400° C.). Also, the controller 6 controls to either increase the GeH$_4$ gas flow rate or to decrease it in sequence and in phase during each temperature regulating process.

(d) In this embodiment, deposition temperature rises by five steps with 25° C. interval between 500° C. and 600° C., but it does not have to be limited in this temperature range. It is possible to experiment within the range anywhere between 400° C. and 700° C. Furthermore, time interval does not have to be limited to 25° C., and temperature may go up (or down) with the e.g. 10° C. or 50° C. interval.

(e) This invention can be certainly applied for not only SiGe deposition but also SiGeC deposition. Furthermore, if this invention is applied for another example doping impurities such as B, P, As and so on during an SiGe or SiGeC deposition, change of deposition rate by doping will not occur and deposition time will be shorter.

(f) This invention can be applied for not only SiGe deposition or SiGeC deposition as an HBT base layer but also counterparts as a discontinuous band layer of MOSFET and other layers. To be more precise, this invention can also be applicable for SiGe deposition or SiGeC deposition as a substrate (buffer layer) to get a strained silicon layer. This invention can be applicable for manufacturing all types of semiconductor devices using SiGe film or SiGeC film.

(g) When a semiconductor manufacture system is used for processing plural substrates at the same time, temperature distribution tends to be uneven in a reaction chamber such as a reaction tube or a chamber. This invention is especially effective in this case. An example of a semiconductor manufacture system for processing plural substrates at the same time is vertical or horizontal batch type systems and cold wall type single-wafer CVD systems.

A resistance heating system and a heating system by lamp are an example of means for processing plural substrates. Especially in a case of a system for forming a hot wall by using the resistance heating systems, temperature distribution tends to be unbalanced in such a system. This invention is effective in this case.

This invention makes it possible to make even films composed of at least silicon and germanium with gradient germanium ratio along a film thickness direction thereof for a short deposition time.

What is claimed is:

1. A method of manufacturing a semiconductor device by depositing films being composed of at least silicon and germanium on a substrate or substrates collocated in a reaction chamber so that a ratio of the germanium composition is changed along a film thickness direction thereof, the method comprising:

changing a temperature of the substrate or the substrates from high to low or from low to high, wherein changing the temperature comprises repeatedly performing:
a temperature changing process in which the temperature of the substrate or the substrates is changed, and
a temperature regulating process in which temperature of the substrate or the substrates is stabilized;

depositing said films composed of at least said silicon and germanium by providing a reactive gas which contains silicon and germanium into the reaction chamber during the temperature regulating process; and processing the substrate or the substrates by lowering partial pressure of the reactive gas during the temperature changing process than during the temperature regulating process.

2. The method of manufacturing the semiconductor device according to claim 1, wherein the temperature regulating process is a process for maintaining a constant temperature of the substrate or the substrates.

3. The method of manufacturing the semiconductor device according to claim 1, wherein the temperature changing process is a process for exhausting the reactive gas remaining in the reaction chamber.

4. The method of manufacturing the semiconductor device according to claim 1, wherein the reactive gas comprises a first reactive gas which contains silicon and a second reactive gas which contains germanium; and the temperature regulating process is a process to change in sequence or in phase partial pressure of the second reactive gas in the reaction chamber.

5. A method of manufacturing a semiconductor device by depositing films being composed of at least silicon and germanium on a substrate or substrates collocated in a reaction chamber so that a ratio of the germanium composition is changed along a film thickness direction thereof, the method comprising:

changing a temperature of the substrate or the substrates from high to low or from low to high, wherein changing the temperature comprises repeatedly performing:
a temperature changing process in which the temperature of the substrate is changed, and
a temperature regulating process in which the temperature of the substrate or the substrates is stabilized;

depositing said films composed of at least said silicon and germanium by providing a reactive gas which contains silicon and germanium into the reaction chamber during the temperature regulating process; and processing the substrate or the substrates by lowering the flow rate of the reactive gas during the temperature changing process than during the temperature regulating process.

6. The method of manufacturing the semiconductor device according to claim 1, wherein said films are not substantially deposited on the substrate or the substrates during the temperature changing process.

7. The method of manufacturing the semiconductor device according to claim 1, wherein the reactive gas comprises a first reactive gas which contains silicon and a second reactive gas which contains germanium; and the temperature regulating process is a process to change in phase partial pressure of the second reactive gas in the reaction chamber, and to change deposition time at each of the above-mentioned phases.

8. The method of manufacturing the semiconductor device according to claim 7, wherein the deposition time is the time when the film thickness at each of the above-mentioned phase is almost the same.

9. The method of manufacturing the semiconductor device according to claim 1, wherein a base layer is deposited in the semiconductor device that contains lamination structure comprising a collector layer, the base layer, and an emitter layer.

10. A semiconductor manufacture system for depositing films composed of at least silicon and germanium on a substrate or substrates collocated in a reaction chamber so that a ratio of the germanium composition is changed along a film thickness direction thereof, the system comprising:

a temperature controller which changes a temperature of the substrate or the substrates from high to low or from low to high, wherein the temperature controller changes the temperature by repeatedly performing:
a temperature changing process for changing the temperature of the substrate or the substrates and
a temperature regulating process in which the temperature of the substrate or the substrates is stabilized; and a gas controller which provides a reactive gas which contains silicon and germanium into the reaction chamber during the temperature regulating process, as well as for lowering partial pressure of the reactive gas during the temperature changing process than that during the temperature regulating process.

* * * * *